United States Patent

Sezi et al.

[11] Patent Number: 6,110,637
[45] Date of Patent: *Aug. 29, 2000

[54] PHOTORESISTS WHICH ARE SUITABLE FOR PRODUCING SUB-MICRON SIZE STRUCTURES

[75] Inventors: Recai Sezi, Roettenbach; Rainer Leuschner; Horst Borndoerfer, both of Erlangen; Michael Sebald, Hessdorf-Hannberg; Siegfried Birkle, Hoechstadt; Hellmut Ahne, Roettenbach, all of Germany

[73] Assignee: Siemens Aktinegesellschaft, München, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/386,136

[22] Filed: Feb. 9, 1995

Related U.S. Application Data

[63] Continuation of application No. 08/121,658, Sep. 15, 1993, abandoned, which is a continuation of application No. 07/811,824, Dec. 20, 1991, abandoned.

[30] Foreign Application Priority Data

Dec. 20, 1990 [DE] Germany .............................. 40 41 001

[51] Int. Cl.$^7$ ....................................................... G03C 1/73
[52] U.S. Cl. .................. 430/270.1; 430/176; 430/271.1; 430/273.1; 430/325; 430/326; 430/910; 522/153
[58] Field of Search ..................................... 430/176, 270, 430/325, 326, 910, 271, 273, 270.1, 271.1, 273.1; 522/148, 153

[56] References Cited

U.S. PATENT DOCUMENTS

| | | | |
|---|---|---|---|
| 4,293,636 | 10/1981 | Okuya | 430/281.1 |
| 4,472,494 | 9/1984 | Hallman et al. | 430/160 |
| 4,491,628 | 1/1985 | Ito et al. | 430/176 |
| 4,508,812 | 4/1985 | Brault | 430/270.1 |
| 4,680,244 | 7/1987 | Lehmann et al. | 430/66 |
| 4,837,124 | 6/1989 | Wu et al. | 430/270.1 |
| 4,912,018 | 3/1990 | Osuch et al. | 430/270.1 |
| 5,071,730 | 12/1991 | Allen et al. | 430/270.1 |
| 5,120,629 | 6/1992 | Bauer et al. | 430/70 |
| 5,384,220 | 1/1995 | Sezi et al. | 430/326 X |

FOREIGN PATENT DOCUMENTS

| | | |
|---|---|---|
| 388484 | 7/1990 | European Pat. Off. . |
| 0 388 484 | 9/1990 | European Pat. Off. . |
| 0 395 917 | 11/1990 | European Pat. Off. . |
| 5381116 | 7/1978 | Japan .................................. 430/270.1 |

OTHER PUBLICATIONS

Ito, H. and M. Ueda, "Thermolysis and Photochemical Acidolysis of Selected Polymethacrylates", Macromolecules, 1988, 21, 1475–1482.
English Translation of JP 53–81116.
EP 0 388 484, Sebald et al. English Translation, Sep. 1990.
EP 394,740—Sezi et al. English Translation Oct. 1990.

Primary Examiner—Bernard Codd
Attorney, Agent, or Firm—Kenyon & Kenyon

[57] ABSTRACT

A photoresist suitable for the production of structures in the submicron range contains the following components:
- a polymer component with carboxylic acid anhydride functions and carboxylic acid tert. butyl ester groups
- a photoinitiator which releases an acid when exposed and
- a suitable solvent.

20 Claims, No Drawings

PHOTORESISTS WHICH ARE SUITABLE FOR PRODUCING SUB-MICRON SIZE STRUCTURES

This application is a continuation of application Ser. No. 08/121,658 filed Sep. 15, 1993, now abandoned, which is a continuation of application Ser. No. 07/811,824 filed Dec. 20, 1991 now abandoned.

BACKGROUND OF THE INVENTION

1. Field of the Invention

The invention relates to a photoresist for the production of structures in the submicron range.

2. Description of Related Art

A high-resolution resist for the production of structures in the submicron range, which can be developed in aqueous alkaline manner, is known from EP-OS 0 388 484. This resist consists of a base polymer which can be developed, and a photoactive component (as well as any other conventional additives which might be necessary), where the base polymer has anhydride functions as the groups which can be developed, and therefore impart the solution. The base polymers which contain anhydride groups, which are DUV-transparent and are suitable both for single-layer and for two-layer technology, preferably contain 10 to 55 mole-% maleic acid anhydride, and are obtained by copolymerization or terpolymerization with allyl trimethyl silane and styrene, as well as with a further monomer, for example maleinimide, if applicable.

Photoresists with such base polymers, which have diazonaphthoquinone or diazoketone derivatives as the photoactive components, * require a dose of about 70 to 80 $mJ/cm^2$ for a zero bias exposure. This relatively high dose can be disadvantageous, because in production lines, for example for highly integrated microelectronic components, a long period of occupation of the cost-intensive exposure devices, (steppers), is required at low throughput. In production, a sensitivity of <20 $mJ/cm^2$ is *) upon DUV exposure, for example at a wave length of 248 nm, therefore generally demanded. When using resists containing silicon, of the type stated, in two-layer technology, there is a further problem that after the transfer of structure in the oxygen plasma, submicron structures are obtained in the bottom resist, which have lost more than 10% of their line width as compared with the structures in the top resist. However, this cannot be tolerated for production.

A photostructuring method is known from EP-OS 0 395 917, which allows the photolithographic transfer of submicron structures in two-layer technology. With this method, the advantages of base polymers, i.e. resists, which contain anhydrid groups, are utilized, and at the same time, a pattern transfer true to size is made possible, i.e. the exact mask dimensions are reproduced in the bottom resist in two-layer technology. This is done by chemical expansion of the structures containing anhydride groups in the top resist, to an extent that precisely corresponds to the loss in dimensions which occurs during the structure transfer in the oxygen plasma. With this method, again, however, a relatively high dose is required for structuring the top resist, specifically a dose of about 90 $mJ/cm^2$ (in the DUV range).

Furthermore, with the stated photostructuring method, the opportunity to produce structure dimensions which are smaller than pre-determined by the physical resolution limit of the lithography technology used was opened up for the first time, i.e. the space width in the photoresist structure is reduced in size to below the resolution limit. This is done by chemical expansion of the resist structures which contain anhydride groups, by a measure of several nanometers up to several micrometers, accompanied by a corresponding space narrowing. In this method of procedure, which is possible both with single-layer technology and with two-layer technology, resists with diazoketone derivatives as the photoactive component are used, but these resists do not satisfy the production demands with regard to sensitivity.

A resist composition which works in a positive or negative manner is known from U.S. Pat. No. 4,491,628, in which the problem of the insufficient sensitivity of conventional resists is approached with the concept of so-called chemical amplification. For this purpose, the resist composition has a polymer with groups unstable in acids, and a photoinitiator which releases an acid when exposed. In this connection, base polymers which possess alkali-soluble groups, for example phenolic OH groups (in a vinyl phenol polymer), which are blocked by groups which can be split off by acid, for example a tert. butyl or tert. butoxycarbonyl group, are used. The polymer is thus non-soluble in alkali, for the time being. As the photoinitiator (or photo acid), which forms a strong acid upon exposure with DUV light, electron beams or X-rays, so-called Crivello salts, i.e. onium salts, such as triphenyl sulfonium hexafluorophosphate, are used.

The great sensitivity of resist compositions of the type stated above is explained by the fact that during a temperature treatment ("post exposure bake") which follows the acid during exposure, a single proton which was generated from the photo acid during exposure, specifically by a photon, catalytically splits off a plurality of the groups which can be split off by acid, i.e releases a plurality of alkali-soluble groups. In contrast, a maximum of one single alkali-soluble group can be produced per proton in conventional resists with diazo compounds (as the photoactive component). A sensitivity which reaches 5 to 55 $mJ/cm^2$ with UV exposure, i.e. is 10 $\mu C/cm^2$ with electron beam exposure, is stated for the resist compositions indicated; furthermore, they show high contrast. However, disadvantages of these systems are that a transfer of structures true to size is not possible, that no narrow spaces can be produced, i.e. spaces with a width less than the resolution limit, and that either the DUV transparency, or the etch resistance to substrate etch processes is relatively low.

A photoresist composition for DUV and excimer laser lithography is known from U.S. Pat. Nos. 4,837,124 and 4,912,018 which also functions according to the principle of chemical amplification. For this purpose, the resist composition has 1 to 50% of a latent photo acid and 50 to 99% of a polymer which forms a film and contains imide groups, both dissolved in a solvent. In this connection, a sufficient number of the imide groups are blocked with groups unstable in acid to make the polymer alkali-insoluble; such groups are oxycarbonyl groups, especially the tert. butoxycarbonyl group. The groups unstable in acid are split off by means of the photo acid, in the manner described, which causes the polymer to become alkali-soluble, due to the imide groups which occur as a result. The advantage of this composition is an improved resolution capacity, but it demonstrates the same disadvantages as the resist composition according to U.S. Pat. No. 4,491,628. In addition, it is disadvantageous that the introduction of the groups unstable in acid by means of a polymer-analogous reaction cannot be controlled, and does not proceed in reproducible manner, and therefore also does not take place in quantitative manner.

SUMMARY OF THE INVENTION

It is an object of the invention to make a photoresist available, which allows transfer of structures true to size in two-layer technology, and the production of structures (spaces and/or holes) beyond the resolution limit, has a high transparency, is sensitive for UV light, electron beams and X-rays, and possesses a great sensitivity (<20 mJ/cm$^2$ in the DUV range), as well as a high resolution capacity, also in the submicron range.

This is accomplished, according to the invention, in that the photoresist contains the following components:

a polymer component with carboxylic acid anhydride functions and carboxylic acid tert. butyl ester groups, a photoinitiator which releases an acid when exposed, and a suitable solvent.

DETAILED DESCRIPTION OF THE INVENTION

In the photoresist according to the invention it is essential that the polymer component has two different kinds of functional groupings, namely anhydride functions and tert. butyl ester groups. These two groupings can be present in different polymers, but it is advantageous if they are present in one and the same polymer.

The anhydride functions are preferably based on maleic acid anhydride; another compound of this type is itaconic acid anhydride, for example. The polymers can demonstrate both cyclic anhydride functions, with these being arranged in the main chain or in the side chain, and non-cyclic, i.e. linear anhydride functions. A number of corresponding monomers are known from EP-OS 0 388 484, such as acrylic or methacrylic acid anhydride and vinyl phthalic acid anhydride.

Preferably, the carboxylic acid tert. butyl ester groups are based on acrylic acid and methacrylic acid tert. butyl esters, as well as maleic acid and fumaric acid tert. butyl esters. Other compounds of this type are, for example, vinyl benzoic acid tert. butyl ester and cinnamic acid tert. butyl ester.

Mixed polymers made from carboxylic acid tert. butyl esters and carboxylic acid anhydrides which can be used in the photoresist according to the invention are the object of the U.S. Pat. No. 5,616,667, entitled "Mixed Polymers". Here, the mixed polymers can be structured not only as copolymers (of the type stated), but also as terpolymers. An unsaturated compound is additionally built into such polymers, for example an unsaturated aromatic compound, such as styrene, α-methyl styrene or vinyl naphthalene. Another unsaturated compound which can be advantageously built into the polymers is allyl trimethyl silane, for example.

Preferably, copolymers of maleic acid anhydride and acrylic acid or methacrylic acid tert. butyl ester are used in the method according to the invention. However, terpolymers can also be advantageously used, with these being produced from monomer mixtures containing a tert. butyl ester of an unsaturated carboxylic acid, maleic acid anhydride and allyl trimethyl silane or styrene. Preferably, the polymerization is initiated radically. The polymers are characterized by high transparency both in the near and the deep UV range, and are therefore particularly well suited for use in high-contrast DUV photoresists, for example for exposures with KrF excimer laser exposure devices (at a wave length of 248 nm).

In the photoresist according to the invention, known compounds can be used as the photoinitiator, which is also called photo acid in the present case (see in this regard, for U.S. Pat. Nos. 4,491,628, 4,837,124 and 4,912,018. The only important thing for the selection of the photoinitiator is the required property of releasing an acid upon exposure. Exposure takes place with UV light or with electron beams or X-rays, where it is advantageous if a strong acid is formed. The acid then causes the tert. butyl ester to split off from the carboxylic acid tert. butyl ester group, specifically during temperature treatment which follows the exposure. As a result of this acid-catalyzed deblocking, the polymer, which was alkali-insoluble at first, becomes alkali-soluble.

In the resist according to the invention, the photoinitiator is preferably an onium compound. Such compounds, which are also referred to as Crivello salts, are, for example, diphenyl iodonium and triphenyl sulfonium triflate (the trifluoromethane sulfonyl group is referred to as triflate). Other photoinitiators which can be used are, for example, triazine derivatives. The photoinitiator is generally used in a concentration of 1 to 20% by mass, with reference to the dry photoresist, i.e. the solvent-free resist composition.

Known resist solvents are used as the solvent. The only requirement which is important for the selection of the solvent is that both the polymer component and the photoinitiator have to be dissolved. In addition, defect-free resist layers have to be formed on the substrates, for example on silicon wafers or on wafers coated with a bottom resist, using the known coating methods. Preferably, the solvent is cyclohexanone or methoxypropyl acetate; in addition, diethylene glycol dimethyl ether, for example, can also be used.

The photoresist according to the invention exhibits a sensitivity of 1 to 5 mJ/cm$^2$. In addition to the components mentioned, the photoresist according to the invention can also contain other additives. Such additives are, for example, sensitizers which make it possible to sensitize the photoresist for exposures in the near UV range, for example at 365 nm. A particularly suitable sensitizer in this connection is perylene.

By means of the photoresist according to the invention, both positive and negative structures can be produced. Furthermore, this resist can be used both in single-layer resist technology (with wet development) and in two-layer resist technology (with wet and dry development).

In single-layer technology, it is preferable to use those polymers which have aromatic groupings, in addition to carboxylic acid anhydride and carboxylic acid tert. butyl ester groups. Such polymers can be obtained, in simple manner, by radical polymerization of maleic acid anhydride and a tert. butyl ester with an aromatic monomer, such as styrene, for example, or, if necessary, with one or more additional monomers, such as vinyl naphthalene. However, other aromatic monomers, such as the ones known from EP-OS 0 388 484, can also be used. In this connection, both the molar proportion of tert. butyl ester and that of the other monomers can be easily and reproducibly controlled in the polymer by way of the monomer mixture ratio. For use in single-layer technology, terpolymers of 10 to 55 mole-% maleic acid anhydride, 10 to 55 mole-% tert. butyl ester, and 10 to 70 mole-% styrene are preferred; the individual components always add up to 100%.

In two-layer technology, it is preferable to use those polymers which have groups containing silicon, in addition to carboxylic acid anhydride and carboxylic acid tert. butyl ester groups. Such polymers can be obtained, in simple manner, by radical polymerization of maleic acid anhydride and a tert. butyl ester with a monomer containing silicon, such as allyl trimethyl silane, for example, or, if necessary, with one or more additional monomers, such as styrene. However, other monomers containing silicon, such as the ones known from EP-OS 0 388 484, can also be used. In this connection, both the molar proportion of tert. butyl ester and that of the other monomers can be easily and reproducibly controlled in the polymer by way of the monomer mixture ratio. For use in two-layer technology, terpolymers of 10 to 55 mole-% maleic acid anhydride, 10 to 55 mole-% tert. butyl ester, and 10 to 55 mole-% allyl trimethyl silane are preferred; the individual components always add up to 100%.

The photoresist according to the invention can be used to special advantage in the photostructuring methods which are known from EP-OS 0 395 917, namely in methods for varying the width of photoresist structures. This is the transfer of structures true to size in two-layer technology, for one thing, and the production of structures beyond the resolution limit, for another thing. With both methods of procedure, it is important for the selection of the resist polymer that the polymer has anhydride groups. But the fact that the polymer reacts very rapidly with aminosiloxanes, which are used in this method as a so-called expansion agent, and results in very etch-resistant layers, even at a very low layer thickness, is particularly surprising. Furthermore, after a dry-etch process with $O_2$/RIE, highly resolved structures with very steep slopes are obtained. The photoresist according to the invention furthermore allows very great process reliability.

In general, the production of structures with the resist according to the invention takes place in the following stages:
1. Application of the resist to a substrate; the resist must be transparent for the exposure wave length, etch resistance to substrate etch processes is not required.
2. Drying of the resist.
3. Exposure in an imagewise manner; during this step, a strong acid is formed in the exposed areas.
4. Temperature treatment ("post exposure bake"); here, the temperature/time combination (on a hot plate) is selected in such a way that acid-catalyzed splitting of the tert. butyl ester groups occurs in the polymer, in the exposed areas, and the resist therefore is adjusted so it can be developed.
5. Alkaline development.
6. Subsequent chemical treatment; which results in an expansion of the resist lines, i.e. a narrowing of the resist spaces and/or holes; by using an expansion agent containing aromatic groups, etch resistance to substrate etch processes is achieved.

If two-layer technology is used, then a bottom resist is first applied to the substrate, i.e. spin-coated on. This bottom resist, which must be resistant to substrate etch processes, has a polymer containing aromatic groups, usually on a Novolak basis. After spin-coating, the bottom resist is heated; this results in cross-linking of the polymer, which makes it insoluble for top resist solvents. After heating, the top resist is applied to the bottom resist. The former must be transparent for the exposure wave length, etch resistance to dry development in oxygen plasma is not necessary. After drying of the top resist, exposure in an imagewise manner, temperature treatment, alkaline development and subsequent chemical treatment take place, as described above. During the subsequent chemical treatment, the top resist lines are expanded, i.e. the top resist spaces and/or holes are narrowed. By using an expansion agent containing silicon, etch resistance against dry development in oxygen plasma is produced at the same time. Subsequently, structure transfer into the bottom resist still takes place in anisotropic oxygen plasma.

On the basis of embodiments, the invention will be explained in greater detail. In this connection, the following starting materials and/or reagents are used (MT=parts by mass):

Base polymer (1):
  Copolymer of methacrylic acid tert. butyl ester and maleic acid anhydride, produced by radical polymerization of the two monomers in toluene with azoisobutyric acid nitrile as the initiator.
Base polymer (2):
  Copolymer of acrylic acid tert. butyl ester and maleic acid anhydride, produced by radical polymerization of the two monomers in toluene with azoisobutyric acid nitrile as the initiator.
Photoactive component (1):
  This is a compound which forms a strong acid upon exposure; suitable acid forming agents are, in particular, onium compounds known as Crivello salts, as well as triazine derivatives; triphenyl sulfonium trifluoromethane sulfonate is used here.
Photoactive component (2):
  Here, the acid forming agent is diphenyl iodonium trifluoromethane sulfonate.
Developer solution (1);
  Aqueous solution which reacts in base manner, in the form of the commercial metal-ion-free photoresist developer NMD-W 2.38% (Tokyo Ohka Kogyo Co.).
Developer solution (2):
  Organic medium in the form of a mixture of 66 MT xylene and 34 MT anisol; with this solution, the unexposed, non-polar areas can be very selectively developed, while the exposed, polar areas are not changed.
Silylation solution (1):
  Aqueous organic solution, consisting of 4 MT diaminosiloxane, 45.7 MT isopropanol and 50.3 MT ethanol; preferably, an α,ω-aminofunctional siloxane, especially with two end-position aminopropyl groups and 2 to 20 silicon atoms in the chain, is used. An example is the commercially available product Tegomer A-Si 2120 (Goldschmidt). Preferably, aqueous alcoholic media are used as the solvent for the siloxane, especially with isopropanol or ethanol, to which additives which increase the silylation speed can be added, if necessary; polyethylene glycols and their ethers have proven themselves particularly suitable for this.
Silylation solution (2):
  Aqueous organic solution, consisting of 2 MT diaminosiloxane (Tegomer A-Si 2120), 95 MT isopropanol, and 3 MT water.
Silylation solution (3):
  Aqueous organic solution, consisting of 4 MT diaminosiloxane, 75 MT isopropanol, 15 MT diethylene glycol dimethyl ether, and 6 MT water.

EXAMPLE 1

The commercially available positive resist TSMR 8900 (Tokyo Ohka Kogyo Co.) is spun onto a silicon wafer (as the substrate) and dried for 1 min at 90° C.; then it is heated at 240° C. for 35 min in a circulating air oven. After heating, the thickness of the resist serving as the planarization layer is 1.3 µm.

A photoresist consisting of 11.4 MT base polymer (1), 0.6 MT photoactive component (1) and 88 MT methoxypropyl acetate, is spun onto the planarization layer. After drying on a hot plate at 90° C./60 s, the layer thickness of this top resist is 0.32 µm. The resist is then contact-exposed through a mask, at 3 mJ/cm² (device MJB 3, Karl Süss; λ=250 nm) and tempered on the hot plate for 60 s at 90° C. Then the exposed areas are treated with the developer solution (1) in a commercially available puddle development apparatus (type CEM 2000, Convac), at room temperature and standard pressure, for 90 s, and dissolved out, and then rinsed with water for 30 s. Under the same conditions (room temperature, standard pressure), the remaining structures are subsequently silylated, also in a commercially available puddle development apparatus (type CEM 2000-U, Convac), by treatment with the silylation solution (1), for a period of 120 s, and then rinsed with isopropanol for 30 s. Subsequently, the silicon wafer is placed into a plasma etch system (type MIE 720, Material Research Corporation) and the resist is dry-developed in oxygen plasma ($O_2$/RIE: 1.9 mTorr gas pressure, 40 V bias voltage, 0.9 kW output, with magnet; duration: 80 s). Positive structures up to 0.4 μm, with a height of 1.6 μm, a line/space ratio of 1:1 and vertical slopes are obtained.

EXAMPLE 2

The method of procedure is the same as in Example 1, but the exposure (through a mask) takes place by means of a DUV stepper (Canon Excimer Laser Stepper FPA 4500; λ=248 nm, NA=0.37), at 18 mJ/cm². The dose required for 1:1 images is always clearly higher when using this stepper than with contact exposure according to Example 1. After dry development ($O_2$/RIE: 20 sccm $O_2$ flow, 300 W output, 50 G magnet; duration: 180 s), in a plasma etch system (Precision 5000), positive structures up to 0.3 μm, with a height of 1.6 μm and a line/space ratio of 1:1, and contact holes, true to size, up to 0.4 μm are obtained; the structures and contact holes have 90° slopes.

EXAMPLE 3

The procedure is the same as in Example 1, but dry development in the plasma etch system (type MIE 720, Material Research Corporation) takes place in a two-stage etch process. First, etching takes place for 6 s with a gas mixture of oxygen and tetrafluoromethane ($O_2$ flow: 70 sccm; $CF_4$ flow: 9 sccm; total gas pressure: 8.1 mTorr; bias voltage: 40 V; with magnet) and then, corresponding to Example 1, dry-development is carried out in a pure oxygen plasma ($O_2$/RIE: 1.9 mTorr gas pressure, 40 V bias voltage, 0.9 kW output, with magnet; duration: 80 s). Positive structures up to 0.4 μm with vertical slopes and a line/space ratio of 1:1 are obtained.

EXAMPLE 4

The procedure is the same as in Example 2, but the structures remaining after development with the developer solution (1) are treated with the silylation solution (1) for a period of 200 s. The extended silylation leads to a clear narrowing of the spaces and contact holes, after the dry development in oxygen plasma described in Example 2. Thus, for example, instead of a sequence of lines and spaces with a width of 0.3 μm, a sequence of lines with a width of 0.45 μm and spaces with a width of 0.15 μm is obtained. The positive structures and contact holes obtained again have vertical slopes.

EXAMPLE 5

A resist consisting of 13.95 MT base polymer (2), 1.05 MT photoactive component (2) and 85 MT diethylene glycol dimethyl ether is spun onto a planarization layer corresponding to Example 1 and dried at 100° C. for 60 s. This top resist then has a layer thickness of 0.32 μm. After exposure of the resist through a mask at 6 mJ/cm² (Canon Excimer Laser Stepper FPA 4500; λ=248 nm, NA=0.37), tempering takes place at 110° C. for 60 s, then the exposed areas are dissolved out by treatment with the developer solution (1) at room temperature and standard pressure, for a period of 60 s, in a puddle development apparatus (type CEM 2000, Convac); subsequently, rinsing with water takes place for 30 s. The remaining structures are treated with the silylation solution (2), for a period of 60 s, at room temperature and standard pressure, in a puddle development apparatus (type CEM 2000-U, Convac), then rinsed with isopropanol for 30 s. After dry-development of the resist ($O_2$/RIE: 20 sccm $O_2$ flow, 300 W output, 50 G magnet; duration: 180 s) in a plasma etch system (Precision 5000), positive structures up to 0.3 μm line/space ratio 1:1) and 0.4 μm contact holes, true to size, vertical slopes are obtained.

EXAMPLE 6

The procedure is the same as in Example 5, but the silylation period (in the puddle development apparatus) is extended to 100 s. This causes the spaces to narrow after corresponding dry development, in comparison with the results according to Example 5, i.e. instead of 0.4 μm contact holes, 0.3 μm contact holes with vertical slopes are obtained.

EXAMPLE 7

A resist corresponding to Example 1 is spun onto the planarization layer and dried, as described. After contact exposure through a mask, at 1.8 mJ/cm² (device MJB 3, Karl Süss; λ=250 nm), it is tempered for 60 s at 110° C. By means of treatment (puddle development apparatus corresponding to Example 1; room temperature, standard pressure) with the developer solution (2) for a period of 60 s, the unexposed areas are selectively dissolved out, then rinsing with isopropanol takes place for 30 s. In the same apparatus and under the same external conditions, the remaining negative structures are subsequently treated with the silylation solution (3), then rinsed with isopropanol for 30 s. After dry development of the resist ($O_2$/RIE: 2 mTorr gas pressure, 50 V bias voltage, 0.9 kW output, with magnet) in a plasma etch system (type MIE 720, Material Research Corporation), negative structures up to 0.4 μm, with vertical slopes and a line/space ratio of 1:1 are obtained. The structures have a height of 1.6 μm.

EXAMPLE 8

A resist consisting of 21.85 MT base polymer (2), 1.15 MT photoactive component (1) and 77 MT methoxypropyl acetate is spun onto a silicon wafer and dried at 90° for 60 s. Then the resist, without preceding exposure, is treated in a puddle development apparatus (room temperature, standard pressure), corresponding to Example 1, with the silylation solution (1) for 360 s, then rinsed with isopropanol for 30 s and dried. Subsequently, the wafer is placed into a plasma etch system (type MIE 720, Material Research Corporation), and dry-etched for 200 s in oxygen plasma ($O_2$/RIE: 1.9 mTorr gas pressure, 40 V bias voltage, 0.9 kW output, with magnet). From the measurements of layer thickness before and after etching, an etch rate of the silylated layer of 0.73 nm/s is calculated. In this connection, it does not make any difference whether or not the unexposed resist was treated with the developer solution (1) before silylation.

If resists as they are known from the state of the art (see EP-OS 0 388 484 and 0 395 9176) are silylated as indicated there (see the corresponding embodiments), and the silylated layers are etched under the conditions described above, then etch rates of the silylated layers which lie between 0.95 and 1.05 nm/s are measured in all cases. The layers containing silicon produced within the scope of the present invention generally demonstrate an etch resistance during dry development in oxygen plasma ($O_2$/RIE) that is approximately 30% greater, in comparison to the state of the art.

What is claimed is:

1. A radiation-sensitive layer for use as a photoresist which is suitable for the production of submicron structures, comprising:

a polymer component with carboxylic acid anhydride functions and carboxylic acid tert. butyl ester groups, the polymer component being alkali insoluble and soluble in a resist solvent, a photoinitiator which releases a strong acid when exposed and a solvent.

2. The radiation-sensitive layer according to claim 1 wherein the carboxylic acid anhydride functions are maleic acid anhydride functions.

3. The radiation-sensitive layer according to claim 2 wherein the polymer component is a copolymer of maleic acid anhydride and acrylic acid tert. butyl ester or methacrylic acid tert. butyl ester.

4. The radiation-sensitive layer according to claim 2 wherein the polymer component is a terpolymer of a tert. butyl ester of an unsaturated carboxylic acid, maleic acid anhydride and allyl trimethyl silane or styrene.

5. The radiation-sensitive layer according to claim 2 wherein the photoinitiator is an onium salt.

6. The radiation-sensitive layer according to claim 2 wherein the solvent is one of cyclohexanone and methoxypropyl acetate.

7. The radiation-sensitive layer according to claim 1 wherein the carboxylic acid tert. butyl ester groups are acrylic acid, methacrylic acid, maleic acid or fumaric acid tert. butyl ester groups.

8. The radiation-sensitive layer according to claim 7 wherein the polymer component is a copolymer of maleic acid anhydride and acrylic acid tert. butyl ester or methacrylic acid tert. butyl ester.

9. The radiation-sensitive layer according to claim 7 wherein the polymer component is a terpolymer of a tert. butyl ester of an unsaturated carboxylic acid, maleic acid anhydride and allyl trimethyl silane or styrene.

10. The radiation-sensitive layer according to claim 7 wherein the photoinitiator is an onium salt.

11. The radiation-sensitive layer according to claim 7 wherein the solvent is one of cyclohexanone and methoxypropyl acetate.

12. The radiation-sensitive layer according to claim 1 wherein the polymer component is a copolymer of maleic acid anhydride and acrylic acid tert. butyl ester or methacrylic acid tert. butyl ester.

13. The radiation-sensitive layer according to claim 1 wherein the polymer component is a terpolymer of a tert. butyl ester of an unsaturated carboxylic acid, maleic acid anhydride and allyl trimethyl silane or styrene.

14. The radiation-sensitive layer to claim 1 wherein the photoinitiator is an onium salt.

15. The radiation-sensitive layer according to claim 14 wherein the onium salt is selected from the group consisting of diphenyl iodonium and triphenyl sulfonium trifluoromethane sulfonate.

16. The radiation-sensitive layer according to claim 1 wherein the solvent is one of cyclohexanone and methoxypropyl acetate.

17. The radiation-sensitive layer according to claim 1 further comprising a sensitizer.

18. The radiation-sensitive layer according to claim 17 wherein the sensitizer is perylene.

19. The radiation-sensitive layer according to claim 1 wherein the photoinitiator is selected from the group consisting of onium salts and triazines derivatives.

20. A two-layer photoresist system which is suitable for the production of submicron structures, comprising a substrate, a bottom resist layer coated on the substrate, and a top resist layer coated on the bottom resist, wherein the top resist includes:

a polymer component with carboxylic acid anhydride functions and carboxylic acid tert. butyl ester groups, the polymer component being alkali insoluble and soluble in a resist solvent, a photoinitiator which releases a strong acid when exposed and a solvent.

* * * * *